(12) United States Patent
Jangjian et al.

(10) Patent No.: US 10,998,194 B2
(45) Date of Patent: *May 4, 2021

(54) METAL GATE STACK HAVING TAALCN LAYER

(71) Applicant: Taiwan Semiconductor Manufacturing Company, Ltd., Hsin-Chu (TW)

(72) Inventors: Shiu-Ko Jangjian, Tainan (TW); Ting-Chun Wang, Tainan (TW); Chi-Cherng Jeng, Tainan (TW); Chi-Wen Liu, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/685,800

(22) Filed: Nov. 15, 2019

(65) Prior Publication Data

US 2020/0090938 A1  Mar. 19, 2020

Related U.S. Application Data

(60) Continuation of application No. 16/042,527, filed on Jul. 23, 2018, now Pat. No. 10,483,112, which is a
(Continued)

(51) Int. Cl.
*H01L 21/28* (2006.01)
*H01L 29/66* (2006.01)
(Continued)

(52) U.S. Cl.
CPC .. *H01L 21/28088* (2013.01); *H01L 21/02183* (2013.01); *H01L 21/82345* (2013.01);
(Continued)

(58) Field of Classification Search
CPC ......... H01L 21/28088; H01L 21/28105; H01L 21/82345; H01L 21/423437; H01L 29/4966; H01L 29/4958; H01L 29/66545
See application file for complete search history.

(56) References Cited

U.S. PATENT DOCUMENTS 6,159,782 A   12/2000  Xiang et al.
6,727,560 B1  4/2004   Pan et al.
(Continued)

*Primary Examiner* — Jose R Diaz
(74) *Attorney, Agent, or Firm* — Haynes and Boone, LLP

(57) ABSTRACT

Gate stacks for improving integrated circuit device performance and methods for fabricating such gate stacks are disclosed herein. An exemplary gate stack includes a gate dielectric layer disposed over the substrate, a multi-function layer disposed over the gate dielectric layer, and a work function layer disposed over the multi-function layer. The multi-function layer includes a first metal nitride sub-layer having a first nitrogen (N) concentration and a second metal nitride material with a second metal nitride sub-layer having a second N concentration. The second metal nitride sub-layer is disposed over the first metal nitride-sub layer and the first N concentration is greater than the second N concentration. In some implementations, the second N concentration is from about 2% to about 5% and the first N concentration is from about 5% to about 15%.

20 Claims, 14 Drawing Sheets

Related U.S. Application Data continuation of application No. 15/149,978, filed on May 9, 2016, now Pat. No. 10,032,634, which is a division of application No. 14/532,228, filed on Nov. 4, 2014, now Pat. No. 9,337,192, which is a continuation-in-part of application No. 14/328,299, filed on Jul. 10, 2014, now Pat. No. 9,337,303, and a continuation-in-part of application No. 13/244,355, filed on Sep. 24, 2011, now abandoned.

(60) Provisional application No. 62/056,278, filed on Sep. 26, 2014.

(51) Int. Cl.

| | | |
|---|---|---|
| *H01L 29/78* | (2006.01) | |
| *H01L 29/49* | (2006.01) | |
| *H01L 21/8234* | (2006.01) | |
| *H01L 21/02* | (2006.01) | |
| *H01L 27/088* | (2006.01) | |
| *H01L 29/165* | (2006.01) | |
| *H01L 29/08* | (2006.01) | |
| *H01L 29/16* | (2006.01) | |
| *H01L 29/161* | (2006.01) | |
| *H01L 29/51* | (2006.01) | |

(52) U.S. Cl.
CPC ........ *H01L 27/088* (2013.01); *H01L 29/0847* (2013.01); *H01L 29/161* (2013.01); *H01L 29/165* (2013.01); *H01L 29/1608* (2013.01); *H01L 29/4958* (2013.01); *H01L 29/4966* (2013.01); *H01L 29/66545* (2013.01); *H01L 29/66636* (2013.01); *H01L 29/7848* (2013.01); *H01L 29/513* (2013.01); *H01L 29/517* (2013.01); *H01L 29/518* (2013.01)

(56) References Cited

U.S. PATENT DOCUMENTS

| | | | |
|---|---|---|---|
| 7,585,716 | B2 | 9/2009 | Cheng |
| 7,871,915 | B2 | 1/2011 | Lim et al. |
| 8,035,165 | B2 | 10/2011 | Yeh et al. |
| 8,232,148 | B2 | 7/2012 | Li et al. |
| 8,404,530 | B2 * | 3/2013 | Ando ................ H01L 21/28088 257/E21.444 |
| 8,802,527 | B1 | 8/2014 | Frank et al. |
| 8,846,550 | B1 | 9/2014 | Shero et al. |
| 9,048,254 | B2 | 6/2015 | Chen et al. |
| 9,337,192 | B2 * | 5/2016 | Jangjian .............. H01L 29/1608 |
| 9,337,303 | B2 * | 5/2016 | Jangjian ........... H01L 29/66545 |
| 2009/0001480 | A1 | 1/2009 | Cheng |
| 2009/0181504 | A1 | 7/2009 | Lin |
| 2010/0052075 | A1 | 3/2010 | Yeh et al. |
| 2010/0068875 | A1 | 3/2010 | Yeh et al. |
| 2010/0081262 | A1 | 4/2010 | Lim et al. |
| 2011/0215409 | A1 | 9/2011 | Li et al. |
| 2012/0228773 | A1 | 9/2012 | Brown et al. |
| 2013/0049141 | A1 | 2/2013 | Cheng |
| 2013/0087856 | A1 * | 4/2013 | Ortolland ........ H01L 21/823842 257/365 |
| 2014/0154877 | A1 | 6/2014 | Besser et al. |
| 2014/0291760 | A1 | 10/2014 | Cheng et al. |

* cited by examiner

METAL GATE STACK HAVING TAALCN LAYER

This application is a continuation of U.S. patent application Ser. No. 16/042,527, filed Jul. 23, 2018, now U.S. Pat. No. 10,483,112, which is a continuation of U.S. patent application Ser. No. 15/149,978, filed May 9, 2016, now U.S. Pat. No. 10,032,634, which is a divisional of U.S. patent application Ser. No. 14/532,228 filed Nov. 4, 2014, now U.S. Pat. No. 9,337,192, which claims the benefit of U.S. Provisional Patent Application Ser. No. 62/056,278, filed Sep. 26, 2014, and is a continuation-in-part of U.S. patent application Ser. No. 14/328,299, filed Jul. 10, 2014, now U.S. Pat. No. 9,337,303, which is a continuation-in-part of U.S. patent application Ser. No. 13/244,355, filed Sep. 24, 2011. The entire disclosures of each of the above listed applications are hereby incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. These advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

DETAILED DESCRIPTION

Figure 1:
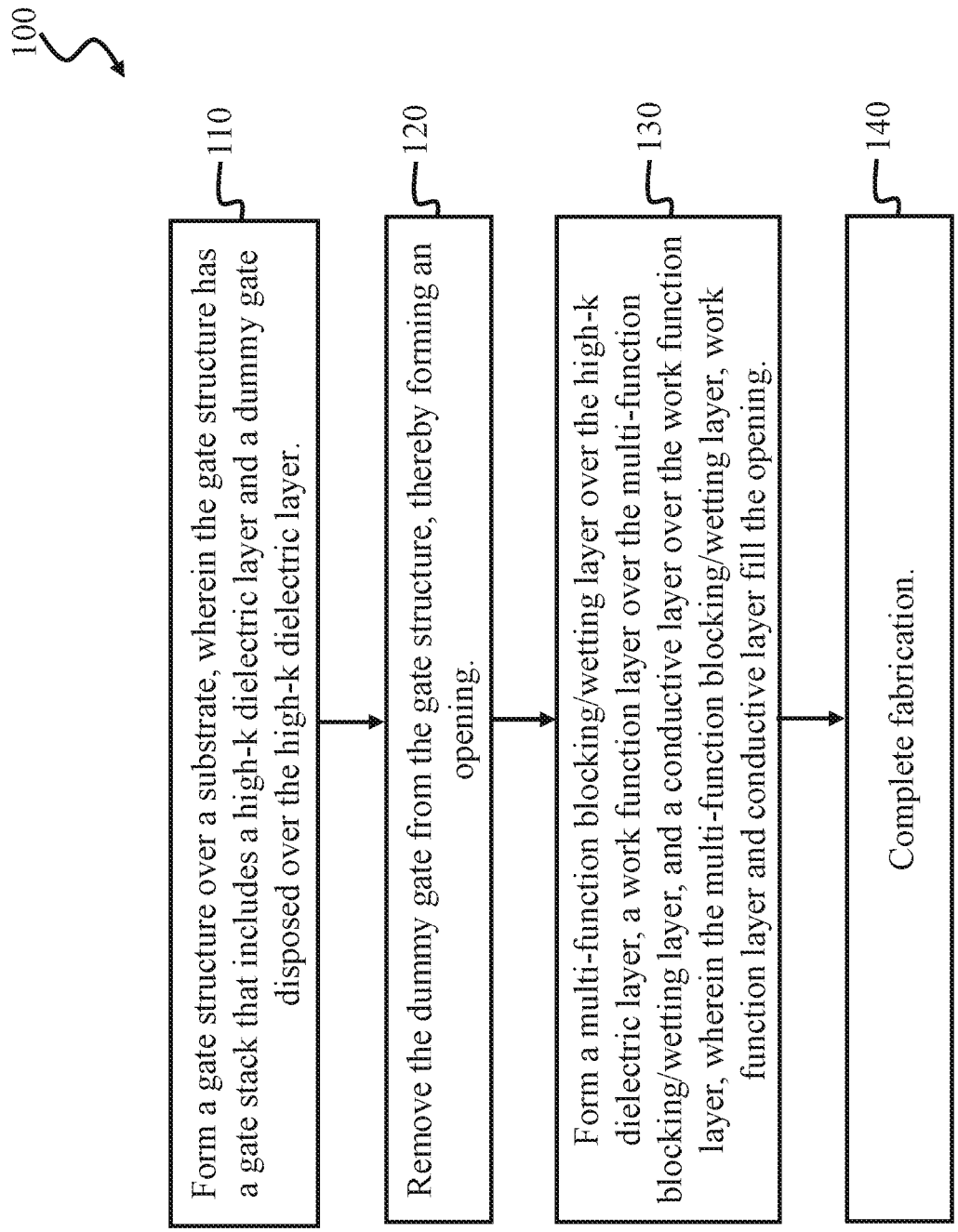
FIG. 1 is a flow chart of a method for fabricating an integrated circuit device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of a method 100 for fabricating an integrated circuit device, in portion or entirety, according to various aspects of the present disclosure. The method 100 begins at block 110 where a gate structure is formed over a substrate. The gate structure has a gate stack that includes a high-k dielectric layer disposed over the substrate and a dummy gate disposed over the high-k dielectric layer. At block 120, the dummy gate is removed from the gate structure to form an opening therein. At block 130, a multi-function blocking/wetting layer, a work function layer, and a conductive layer are formed to fill the opening. The multi-function blocking/wetting layer is formed over the high-k dielectric layer, the work function layer is formed over the multi-function blocking/wetting layer, and the conductive layer is formed over the work function layer. The multi-function blocking/wetting layer includes a material that sufficiently prevents (or reduces) metal impurities from penetrating the high-k dielectric layer (for example, from the conductive layer) during processing, while providing sufficient wettability (in other words, desired interface quality) with the work function layer. The method 100 may continue at block 140 to complete fabrication of the integrated circuit device. Additional steps can be provided before, during, and after the method 100, and some of the steps described can be replaced or eliminated for additional embodiments of the method 100.

In some embodiments, between the operation 110 and the operation 120, the source and drain features may be formed in the active regions on both sides of the dummy gate. In one example, an ion implantation process is performed to introduce dopant (such as phosphorous) to form the source and drain features and an annealing process may be followed to activate the dopant. In another example, a procedure is implemented to form source and drains. The procedure may include performing a first ion implantation process to form lightly doped drain (LDD) features; forming gate spacers by deposition and anisotropic etching; performing a second ion implantation process to form heavily doped source and drains aligned with the gate spacers; and an annealing process is followed to activate the dopant. In another example, source and drain are formed with strain effect by a proper procedure. The procedure may include: the substrate in the source and drain regions is etched to be recessed; and a semiconductor material different from that of the substrate is epitaxially grown in the recesses by selective epitaxy growth with in-situ doping. The semiconductor material is chosen to provide proper strain to the channel to enhance mobility, such as tensile strain to n-channel field effect transistor by using silicon carbide and compressive strain to p-channel field effect transistor by using silicon germanium.

The method 100 may have various embodiments. In some embodiments, the method 100 may alternatively implement a high-k last process, in which the high-k dielectric layer is formed after the removal of the dummy gate. In furtherance of the embodiments, at block 110, a gate stack including gate dielectric (such as silicon oxide) and gate electrode (such as polysilicon) are deposited and patterned. At block 120, both the gate dielectric and gate electrode are removed, resulting in a gate trench. At block 130, a high-k dielectric layer and gate electrode are formed in the gate trench by deposition and polishing such as chemical mechanical polishing (CMP). The gate electrode includes a multi-function blocking/wetting layer, a work function layer, and a conductive layer.

FIGS. 2-7 are diagrammatic cross-sectional views of an integrated circuit device 200, in portion or entirety, at various stages of fabrication according to the method 100 of FIG. 1. FIGS. 2-7 have been simplified for the sake of clarity to better understand the inventive concepts of the present disclosure. The integrated circuit device 200 is described with reference to FIGS. 2-7 and method 100 is further described in details as well in accordance with some embodiments.

In the depicted embodiment, the integrated circuit device 200 includes a field-effect transistor device, such as an n-channel field effect transistor (NFET) or a p-channel field effect transistor (PFET). The integrated circuit device 200 may be included in memory cells and/or logic circuits that include passive components such as resistors, capacitors, inductors, and/or fuses; active components, such as metal-oxide-semiconductor field effect transistors (MOSFETs), complementary metal-oxide-semiconductor transistors (CMOSs), high voltage transistors, and/or high frequency transistors; other suitable components; or combinations thereof. Additional features can be added in the integrated circuit device 200, and some of the features described below can be replaced or eliminated in other embodiments of the integrated circuit device 200.

Figure 2:
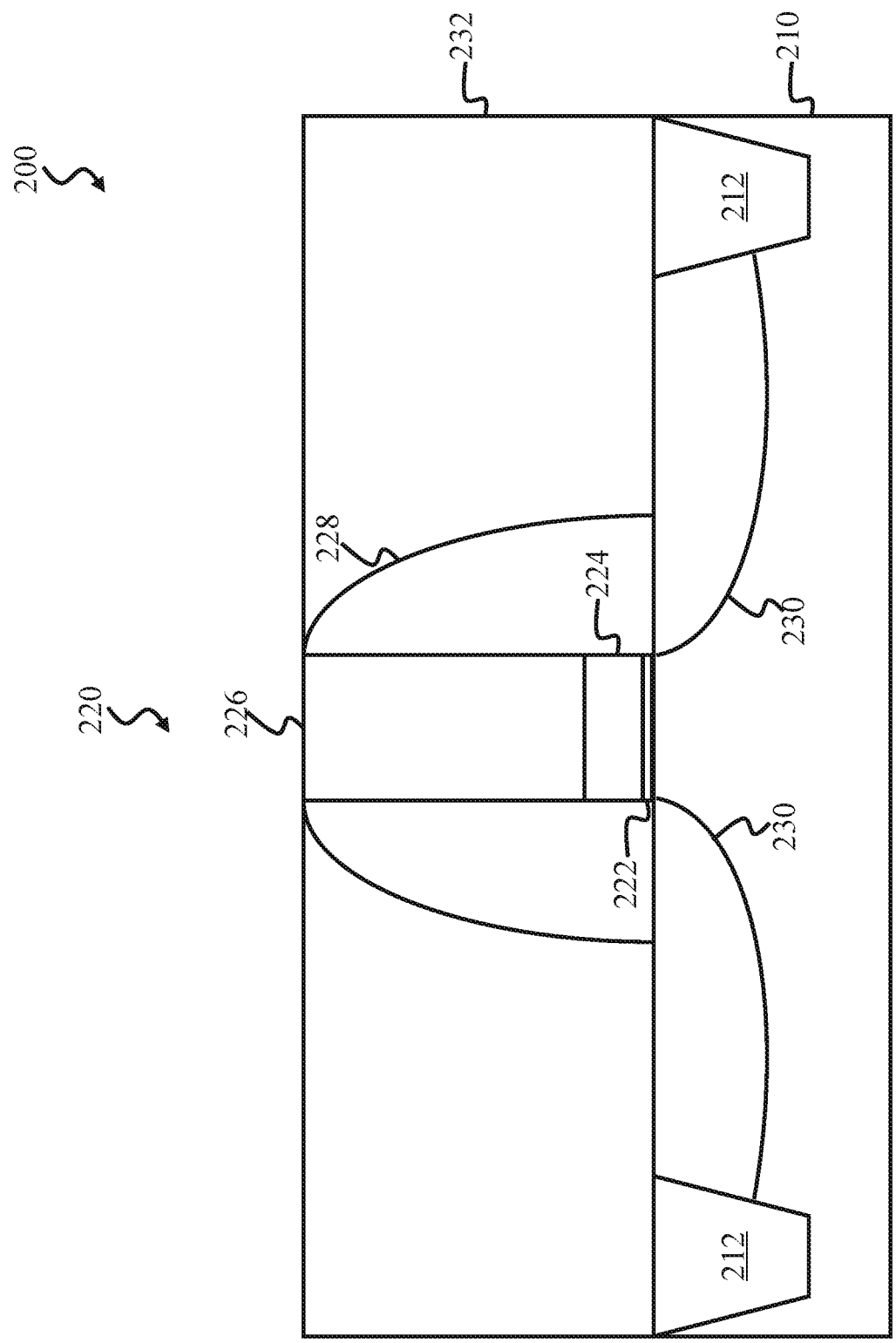
FIGS. 2, 3, 4, 5, 6, and 7 are diagrammatic cross-sectional views of an integrated circuit device during various stages of the method of FIG. 1 according to various aspects of the present disclosure.

In FIG. 2, the integrated circuit device 200 includes a substrate 210. In the depicted embodiment, the substrate 210 is a semiconductor substrate including silicon. Alternatively or additionally, the substrate 210 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, semiconductor substrate 210 may include a doped epi layer, a gradient semiconductor layer, and/or a semiconductor layer overlying another semiconductor layer of a different type, such as a silicon layer on a silicon germanium layer. The substrate 210 includes various doping configurations depending on design requirements of the integrated circuit device 200. For example, the substrate 210 may include various doped regions doped with p-type dopants, such as boron or $BF_2$; n-type dopants, such as phosphorus or arsenic; or combinations thereof. The doped regions may be formed on the semiconductor substrate, in a P-well structure, in a N-well structure, or in a dual-well structure.

An isolation feature 212 is disposed in the substrate 210 to isolate various regions and/or devices of the substrate 210. The isolation feature 212 utilizes isolation technology, such as local oxidation of silicon (LOCOS) and/or shallow trench isolation (STI), to define and electrically isolate the various regions. The isolation feature 212 includes silicon oxide, silicon nitride, silicon oxynitride, other suitable dielectric materials, or combinations thereof. The isolation feature 212 is formed by any suitable process. As one example, forming STI features includes using a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as CMP. In some examples, the filled trench may have a multi-layer structure, such as a thermal oxide liner layer filled with silicon nitride or silicon oxide.

In some embodiments, the semiconductor substrate has a non-planar active region, such as fin-like active regions (or a fin structure). A fin-like active region is a feature of a semiconductor material extruding above the planar surface of the semiconductor substrate and provides multiple surface coupling between a gate and a corresponding channel. The semiconductor material of the fin-like active regions may the same semiconductor material of the semiconductor substrate or alternatively a semiconductor material different from that of the substrate. In some examples, the fin-like active regions may be formed by etching to recessing the STI features or epitaxially growing a semiconductor material on the semiconductor substrate using a proper technique, such as selective epitaxy growth.

A gate structure 220 is disposed over the substrate 210. In the depicted embodiment, the gate structure 220 includes a gate stack having an interfacial dielectric layer 222, a high-k dielectric layer 224, and a dummy gate layer 226. The interfacial dielectric layer 222 and the high-k dielectric layer 224 may collectively be referred to as a gate dielectric layer of the gate structure 220. The gate stack may include additional layers, such as a capping layer, a diffusion/barrier layer, a dielectric layer, a metal layer, other suitable layers, or combinations thereof. The gate structure 220 is formed by a process that includes deposition processes, lithography patterning processes, etching processes, other suitable processes, or combinations thereof. The deposition processes include physical vapor deposition (PVD), chemical vapor deposition (CVD), atomic layer deposition (ALD), plasma enhanced CVD (PECVD), remote plasma CVD (RPCVD), molecular organic CVD (MOCVD), sputtering, plating, other suitable methods, or combinations thereof. The lithography patterning processes include resist coating (for example, spin-on coating), soft baking, mask aligning, exposure, post-exposure baking, developing the photoresist, rinsing, drying (for example, hard baking), other suitable processes, or combinations thereof. The lithography exposure process may be implemented or replaced by other proper methods such as maskless lithography, electron-beam writing, ion-beam writing, and molecular imprint. The etching processes include dry etching, wet etching, or combinations thereof. In some embodiments, the gate structure 220 is formed by a procedure that includes depositing various gate material layers; forming a patterned resist layer by lithography patterning process; etching the gate material layers to form the gate structure 220 using the patterned resist layer as an etch mask; and removing the patterned resist layer by wet stripping or plasma ashing. In some other embodiments, a hard mask layer, such as silicon nitride, may be used as an etch mask during the etching process to pattern the gate material layers. In this case, the procedure to form the gate structure 220 includes depositing various gate material layers; depositing a hard mask layer on the gate material layers; forming a patterned resist layer by lithography patterning process; etching to pattern the hard mask layer using the patterned resist layer as an etch mask; and etching the gate material layers to form the gate structure 220 using the patterned hard mask layer as an etch mask.

The interfacial dielectric layer 222 is disposed over the substrate 210. In an example, the interfacial dielectric layer 222 has a thickness of about 5 Å to about 20 Å. In the depicted embodiment, the interfacial dielectric layer 222 is an oxide-containing layer, such as a silicon oxide ($SiO_2$) layer or a silicon oxynitride (SiON) layer. The interfacial layer 222 may include other suitable materials. The interfacial dielectric layer 222 is formed by a chemical oxide technique, thermal oxide technique, atomic layer deposition (ALD), chemical vapor deposition (CVD), or other suitable technique. A cleaning process, such as an HF-last pre-gate cleaning process (for example, using a hydrofluoric (HF) acid solution), may be performed before the interfacial dielectric layer 222 is formed over the substrate 210.

The high-k dielectric layer 224 is disposed over the interfacial dielectric layer 222, and the dummy gate layer 226 is disposed over the high-k dielectric layer 224. A thickness of the high-k dielectric layer 224 and the dummy gate layer 226 depends on design requirements of the integrated circuit device 200. In an example, the high-k dielectric layer 224 has a thickness of about 5 Å to about 30 Å, and the dummy gate layer has a thickness of about 350 Å to about 700 Å. The high-k dielectric layer 224 includes a high-k dielectric material, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The dummy gate layer 226 includes a material suitable for a gate replacement process. For example, in the depicted embodiment, the dummy gate layer 226 include polysilicon.

The gate structure 220 further includes spacers 228 formed by a suitable process. For example, a dielectric layer, such as a silicon nitride layer, is blanket deposited over the integrated circuit device 200; and then, the silicon nitride layer is anisotropically etched to remove the silicon nitride layer to form spacers 228 as illustrated in FIG. 2. The spacers 228 are positioned adjacent sidewalls of the gate stack (interfacial dielectric layer 222, high-k dielectric layer 224, and dummy gate layer 226) of the gate structure 220. Alternatively or additionally, the spacers 228 include another dielectric material, such as silicon oxide, silicon carbon nitride, or combinations thereof.

Various source/drain features 230 may be disposed in the substrate 210. The source/drain features 230 are interposed by the gate structure 220. The source/drain features 230 may include lightly doped source and drain (LDD) regions and/or heavily doped source and drain (HDD) regions. The LDD and/or HDD regions may be formed by ion implantation or diffusion of n-type dopants, such as phosphorous or arsenic, or p-type dopants, such as boron or $BF_2$. An annealing process, such as a rapid thermal annealing and/or a laser thermal annealing, may be performed to activate dopants of the LDD and/or HDD regions. The LDD and/or HDD regions may be formed at any time in the depicted embodiment. The source/drain features 230 may include raised source/drain features, such as epitaxial features (for example, silicon germanium epitaxial features or silicon epitaxial features). Silicide features may be disposed over the source/drain features 230, for example, to reduce contact resistance. The silicide features may be formed over the source and drain features by a self-aligned salicide process, which can include depositing a metal layer, annealing the metal layer such that the metal layer is able to react with silicon to form silicide, and then removing the non-reacted metal layer.

A dielectric layer 232 is disposed over the substrate 210, such as an interlayer (or inter-level) dielectric (ILD) layer. The dielectric layer 232 includes a dielectric material, such as silicon oxide, silicon nitride, silicon oxynitride, tetraethylorthosilicate (TEOS) formed oxide, phosphosilicate glass (PSG), borophosphosilicate glass (BPSG), low-k dielectric material, other suitable dielectric material, or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. The dielectric layer 232 may include a multilayer structure including multiple dielectric materials. The dielectric layer 232 is formed by a suitable process to a suitable thickness, including by CVD, high density plasma CVD, spin-on, and/or other suitable methods. Subsequent to the deposition of the dielectric layer 232, a chemical mechanical polishing (CMP) process is performed until a top portion of the gate structure 220 is reached/exposed. Particularly, a top portion of the gate stack of the gate structure 220 (here, the dummy gate layer 226) is exposed as illustrated in FIG. 2. Additional layers may be formed overlying and/or underlying the dielectric layer 232.

Figure 3:
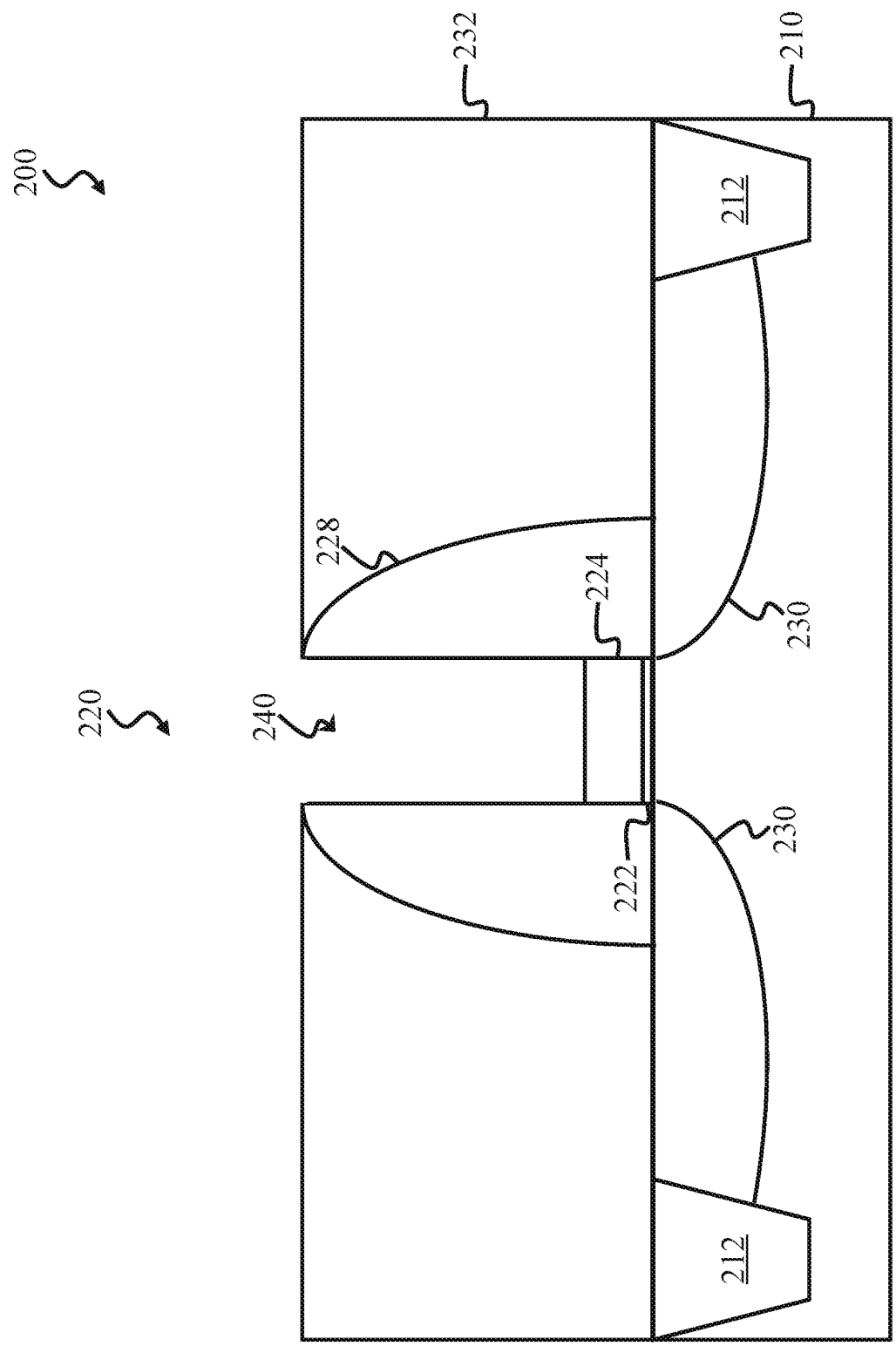

In FIGS. 3-7, a gate replacement process is performed, where the dummy gate layer 226 is replaced with a metal gate. In FIG. 3, the dummy gate layer 226 is removed from the gate stack of the gate structure 220, thereby forming an opening (or gate trench) 240. The opening 240 exposes the high-k gate dielectric layer 224. The dummy gate layer 226 may be removed by an etching process, other suitable process, or combinations thereof. In an example, an etching process selectively etches the dummy gate layer 226.

Figure 4:
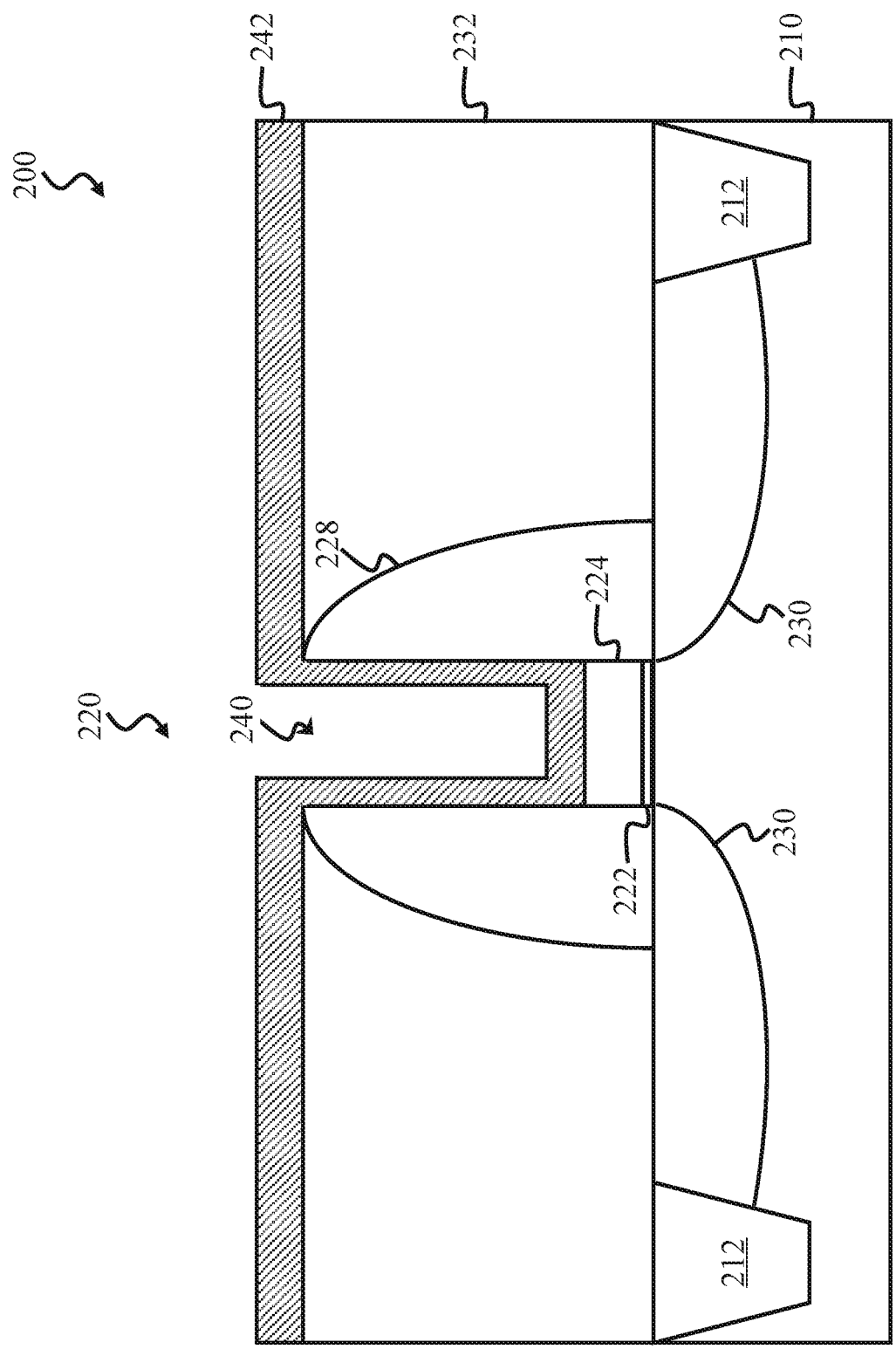

In FIG. 4, a multi-function blocking/wetting layer 242 is formed over the substrate 210, such that the multi-function blocking/wetting layer 242 layer partially fills the opening 240. The multi-function blocking/wetting layer 242 is disposed along sidewalls of the gate structure 220 that define the opening 240. In the depicted embodiment, the multi-function blocking/wetting layer 242 is disposed over the high-k dielectric layer 224. In an example, the multi-function blocking/wetting layer 242 has a thickness of about 30 Å to about 100 Å. The multi-function blocking/wetting layer 242 functions as both a blocking (or barrier) layer and a wetting layer during processing. For example, the multi-function blocking/wetting layer 242 prevents or reduces metal impurities from penetrating any dielectric layers disposed below the multi-function blocking/wetting layer 242 (such as the gate dielectric of the gate stack of the gate structure 220) while enhancing adhesion between the layer underneath it and the layer above it. It also provides desirable interface quality between the multi-function blocking/wetting layer 242 and any material layer formed over the multi-function blocking/wetting layer 242. Accordingly, in the depicted embodiment, the multi-function blocking/wetting layer 242 prevents or reduces metal impurities from penetrating into the high-k dielectric layer 224 and the interfacial dielectric layer 222, while enhancing adhesion between layers beneath and above it, such as the high-k dielectric layer 224 and a layer of the gate stack of the gate structure 220 that is formed over the multi-function blocking/wetting layer 242 (such as the work function layer 244). Such functionality is described in further detail below.

In the depicted embodiment, the multi-function blocking/wetting layer 242 includes tantalum aluminum nitride (TaAlN), and in exemplary embodiments the TaAlN is present as tantalum aluminum carbon nitride (TaAlCN). An atomic concentration of nitrogen and carbon of the TaAlCN layer is optimized, such that the multi-function blocking/wetting layer 242 adequately prevents or reduces metal impurities from penetrating underlying dielectric layers (for example, high-k dielectric layer 224 and interfacial layer 222) while minimally effecting a work function of the integrated circuit device 200. Thus, the nitrogen atomic concentration and carbon atomic concentration are chosen to balance the blocking capability and the desired work function. In the depicted embodiment, the TaAlCN layer includes a nitrogen atomic concentration of about 5% to about 15% and a carbon atomic concentration of about 5% to about 20%. At lower nitrogen and carbon atomic concentrations (for example, lower than about 5%), the blocking capability can move in an undesired direction, while shifting closer to the desired work function. On the other hand, at higher nitrogen and carbon atomic concentrations (for example, nitrogen atomic concentrations of greater than 15% and carbon atomic concentrations of greater than 20%), the balance shifts away from the desired work function and moves toward the desired blocking capability. In the depicted embodiment, the TaAlCN ratio includes a Ta:Al ratio that enhances interface quality (which can be referred to as wettability) between the multi-function blocking/wetting layer 242 and an overlying layer that includes aluminum. For example, the TaAlCN layer 242 includes a Ta:Al ratio of about 1:1 to about 1:3.

The process used to form the multi-function blocking/wetting layer 242, here, the TaAlCN layer, is tuned to achieve optimal blocking and wettability functionality of the multi-function blocking/wetting layer 242. In the depicted embodiment, a physical vapor deposition (PVD) is used to form the multi-function blocking/wetting layer 242. Various process parameters of the PVD process, such as substrate temperature, gas type, gas flow rate, chamber pressure, DC power, bias power, process time, other suitable parameters, or combinations thereof, are tuned to achieve the desired blocking and wettability functionality. Alternatively, an atomic layer deposition (ALD) is used to form the multi-function blocking/wetting layer 242. Various process parameters of the ALD process, such as substrate temperature, gas type, gas flow rate, chamber pressure, process time, other suitable parameters, or combinations thereof, are tuned to achieve the desired blocking and wettability functionality. Alternatively, the multi-function blocking/wetting layer 242 are formed by other processes, such as chemical vapor deposition (CVD), plasma enhanced CVD (PECVD), remote plasma CVD (RPCVD), molecular organic CVD (MOCVD), PVD, ALD, plating, other suitable method, or combinations thereof. Various process parameters of such alternative processes may be tuned to achieve the desired blocking and wettability functionality of the multi-function blocking/wetting layer 242.

In the depicted embodiment, a high pressure PVD process, which maintains the chamber pressure of about 0.1 Torr to about 5 Torr, deposits the multi-function blocking/wetting layer 242 at a temperature of about 250° C. to about 450° C. The high pressure PVD process can ensure that the multi-function blocking/wetting layer 242 adequately, partially fills the opening 240. The high pressure PVD process provides adequate coverage, for example, for high aspect ratio openings, such as the opening 240. For example, in the depicted embodiment, high aspect ratio openings refer to openings having a height to width ratio greater than or equal to 2.2 (height/width≥2.2). Alternatively, high aspect ratio openings may be defined by other height to width ratios.

In another embodiment, the multi-function blocking/wetting layer 242 includes multiple TaAlCN layers with different N %. For example, a bottom TaAlCN layer has a higher N %, such as from about 5% to about 15%, and a top TaAlCN layer has a lower N %, such as from about 2% to about 5%. In this case, the bottom TaAlCN layer serves mainly as a blocking layer while the top TaAlCN layer servers mainly as a work function layer. By choosing a proper C % and N %, an optimized blocking capability is achieved. In an example, C % is in a range from about 5% to about 20%, while the N % is in a range from about 5% to 15%.

Figure 5:
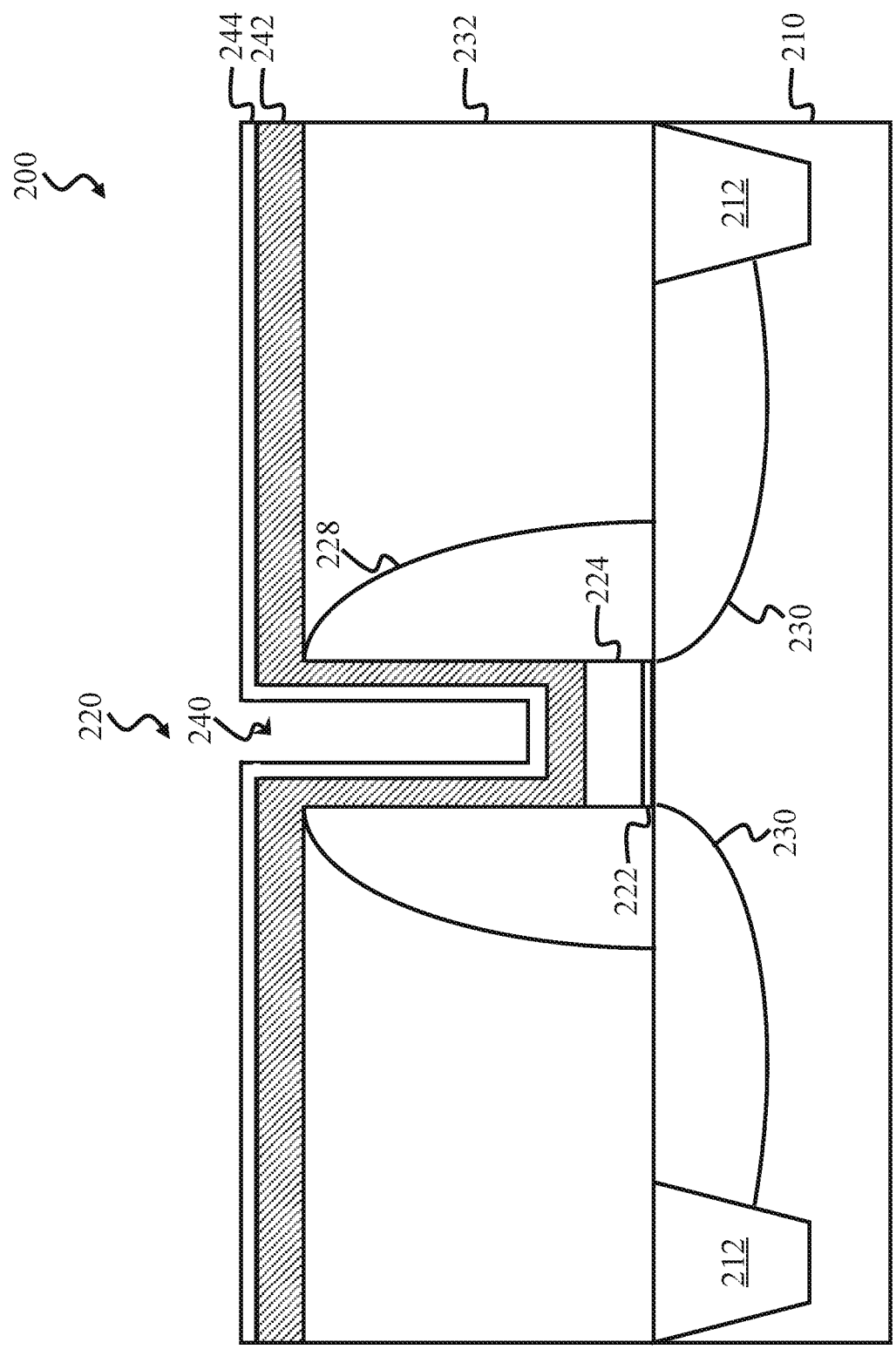

In FIG. 5, a work function layer 244 is formed over the substrate 210, such that work function layer 244 partially fills the opening 240. In the depicted embodiment, the work function layer 244 is disposed over the multi-function blocking/wetting layer 242. In an example, the work function layer 244 has a thickness of about 30 Å to about 100 Å. In another example, the work function layer 244 disposed on the multi-function blocking/wetting layer 242 has a thickness of about 30 Å to about 100 Å, and the work function layer 244 disposed along sidewalls of the opening 240 may have a thickness less than 30 Å, or a thickness of about 30 Å to about 100 Å. The work function layer 244 includes a material that can be tuned to have a proper work function for enhanced performance of the associated device. For example, if a p-type field-effect transistor (PFET) device, the work function layer 244 includes a p-type work function material that can be configured to have a desired work function value (such as close to 5.2 eV or in a range from 4.7 eV to 5 eV) for the gate electrode of the PFET. On the other hand, if an n-type field-effect transistor (NFET) device, the work function layer 244 includes an n-type work function material (such as TaAlCN) that can be configured to have a desired work function value (such as close to 4.2 eV or in a range from 4.1 eV to 4.5 eV) of the gate electrode of the NFET. The work function layer 244 is formed by a physical vapor deposition (PVD), chemical vapor deposition (CVD), atomic layer deposition (ALD), plasma enhanced CVD (PECVD), remote plasma CVD (RPCVD), molecular organic CVD (MOCVD), sputtering, plating, other suitable method, or combinations thereof.

In some embodiments, the TaAlCN layer is formed using a precursor that includes a tantalum-based chemical, an aluminum-based chemical, a carbon-based gas and a nitrogen-based gas. In some examples, the tantalum-based chemical includes pentakis-(dimethylamino) tantalum (PDMAT), triethylaluminum, tantalum chloride (TaCl5), other suitable Ta-containing chemical or a combination thereof. In some examples, the aluminum-based chemical includes triethylaluminum (TEAl), Trimethylaluminium (TMA), aluminum borohydride trimethylamine (AlBT), other suitable Al-containing chemical or a combination thereof. In some examples, the nitrogen-based gas includes $NH_3$, $N_2$, other suitable N-containing chemical or a combination thereof. In some examples, the carbon-based gas includes $CH_x$, such as $CH_3$.

In some embodiments, the work function layer 244 is an n work function layer that includes TaAlCN. In the depicted embodiment, the work function layer 244 includes TaAlCN that has a different composition than the TaAlCN in the multi-function blocking/wetting layer 242. For example, the nitrogen atomic concentration in the work function layer 244 is lower than the nitrogen atomic concentration in the multi-function blocking/wetting layer 242. The nitrogen atomic concentration is chosen to balance the blocking capability and the desired work function. In an embodiment, the nitrogen atomic concentration in the work function layer 244 is about 2% to about 5%. Aluminum in the work function layer 244 has a high mobility and can easily penetrate an under layer when the nitrogen atomic concentration is lower (e.g., less than about 2%). At higher nitrogen atomic concentrations (e.g., higher than about 2%), the nitrogen in the work function layer 244 can bond to the aluminum, form a stable phase, and reduce the penetration of aluminum into an under layer. Even higher nitrogen atomic concentrations (e.g., higher than about 5%), however, can cause a shift away from a target or desired work function.

In some embodiments, the work function layer 244 is an n work function layer for NFET and having a work function ranging from about 4.1 eV to about 4.5 eV. In furtherance of the embodiments, the n work function layer includes titanium (Ti), aluminum (Al), titanium aluminum (TiAl), tantalum (Ta), or zirconium silicon ($ZrSi_2$).

Figure 6:
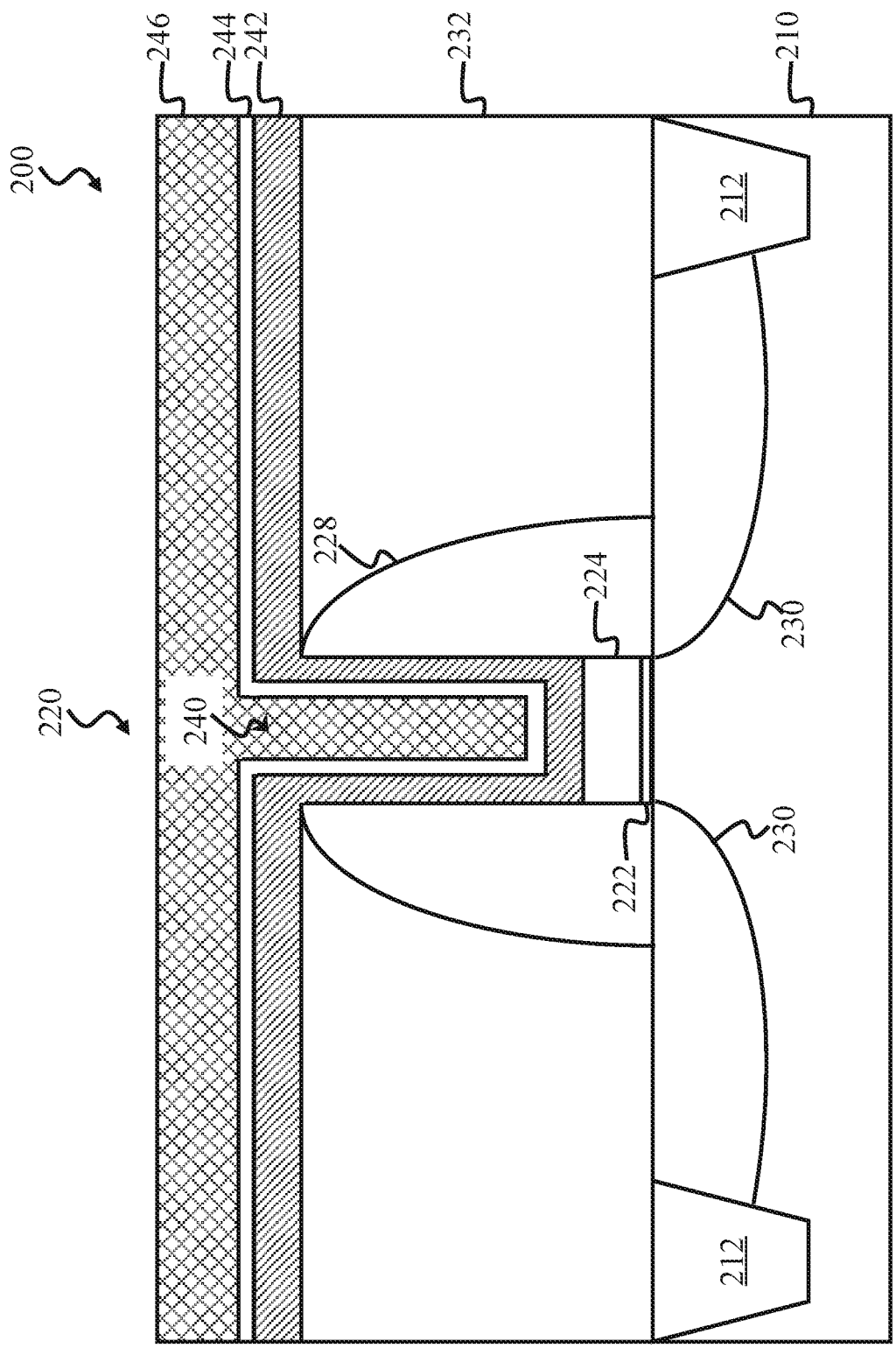

In FIG. 6, a conductive layer 246 is formed over the substrate 210, such that the conductive layer 246 partially fills the opening 240. The conductive layer 246 is disposed over the work function layer 244. In an example, the conductive layer 246 has a thickness of about 300 Å to about 1,500 Å. In the depicted embodiment, the conductive layer 246 includes aluminum. Alternatively or additionally, the conductive layer 246 includes copper, tungsten, a metal alloy, a metal silicide, other conductive material, or combinations thereof. The conductive layer 246 is formed by a physical vapor deposition (PVD), chemical vapor deposition (CVD), atomic layer deposition (ALD), plasma enhanced CVD (PECVD), remote plasma CVD (RPCVD), molecular organic CVD (MOCVD), sputtering, plating, other suitable method, or combinations thereof.

Figure 7:
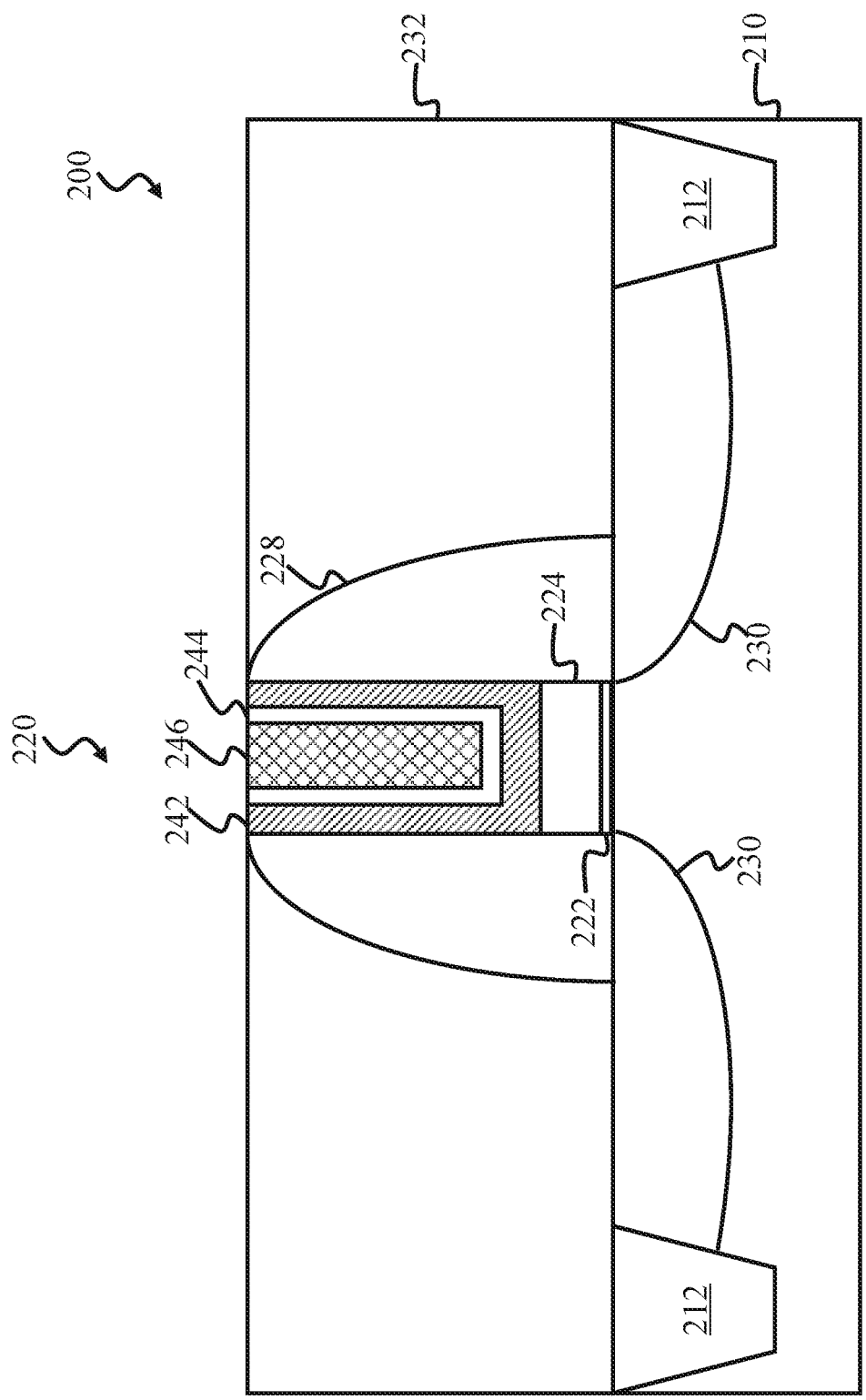

In FIG. 7, a chemical mechanical polishing (CMP) process is performed until the dielectric layer 232 is reached or exposed. The CMP process thus removes portions of the multi-function blocking/wetting layer 242, work function layer 244, and the conductive layer 246 that are disposed over the dielectric layer 232. The remaining portions of the multi-function blocking/wetting 242, work function layer 244, and the conductive layer 246 combine to fill the opening 240, such that the gate stack of the gate structure 220 includes the interfacial dielectric layer 222, the high-k dielectric layer 224, the multi-function blocking/wetting 242, work function layer 244, and the conductive layer 246. The multi-function blocking/wetting layer 242, the work function layer 244, and the conductive layer 246 may collectively be referred to as a gate electrode of the gate structure 220.

The integrated circuit device 200 may include other features. For example, a multilayer interconnection (MLI) including metal layers and inter-metal dielectric (IMD) layers may be formed over the substrate 210, such as over the dielectric layer 232, to electrically connect various features or structures of the integrated circuit device 200. The multilayer interconnection includes vertical interconnects, such as vias or contacts, and horizontal interconnects, such as metal lines. In an example, the MLI includes interconnection features to the source/drain features 230 and/or the gate stack of the gate structure 220. The various interconnection features include various conductive materials including aluminum, copper, titanium, tungsten, alloys thereof, silicide materials, other suitable materials, or combinations thereof. In an example, a damascene process or dual damascene process is used to form a copper or aluminum multilayer interconnection structure.

The integrated circuit device 200 exhibits reduced leakage current, leading to improved device performance. Such reduced leakage current and improved device performance may be achieved by multi-function blocking/wetting layer 242 in the gate stack of the gate structure 220. The multi-function blocking/wetting layer 242 can sufficiently block metal impurities from penetrating underlying dielectric layers, while providing sufficient wettability (interface quality) to overlying layers.

The integrated circuit device 200 and the method 100 making the same may have other embodiments without departure from the scope of the present disclosure. A few of embodiments are provided below. The similar features and similar operations are not repeated for simplicity.

Figure 8:
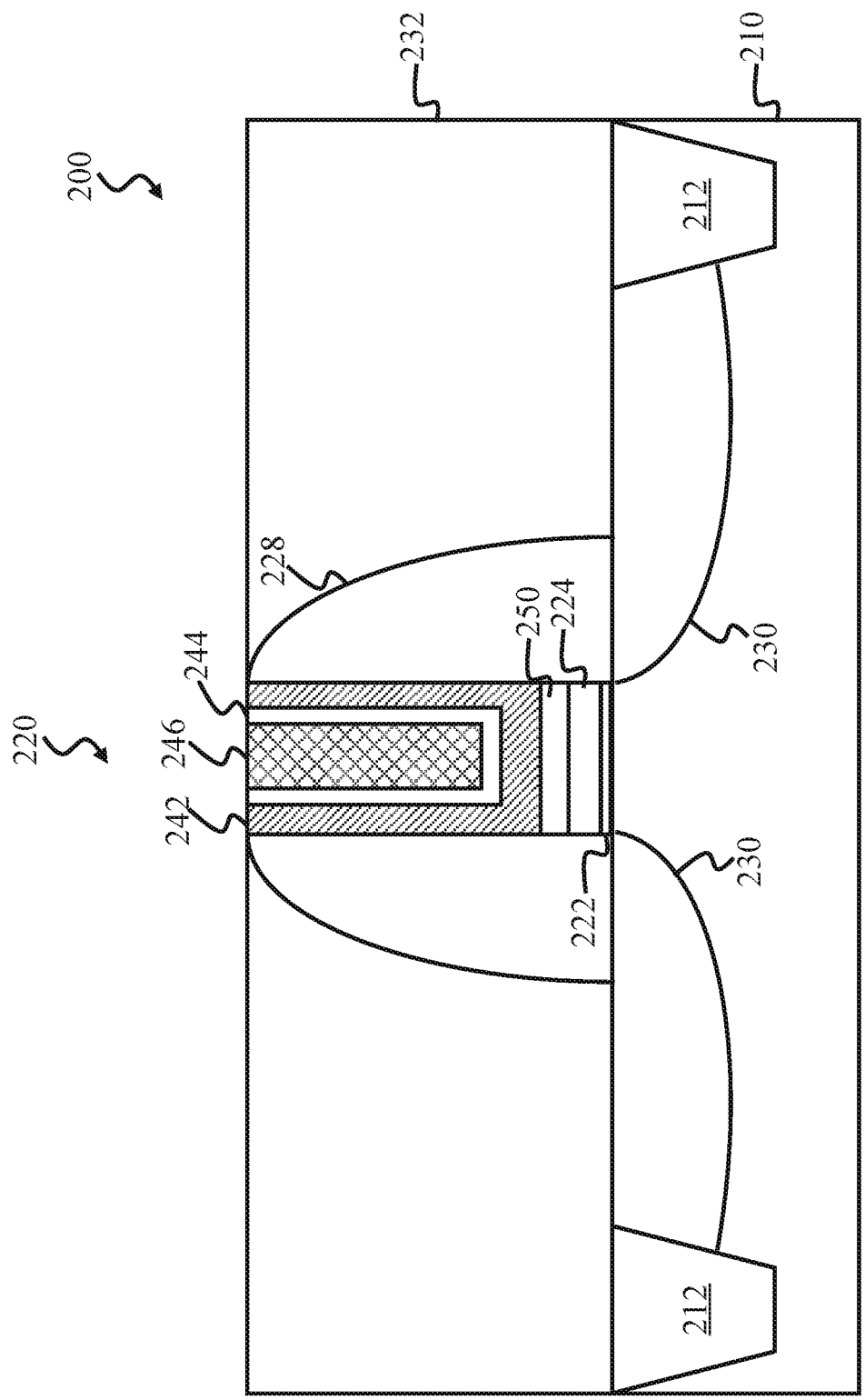
FIGS. 8, 9, 10, and 11 are diagrammatic cross-sectional views of an integrated circuit device constructed according to various embodiments.

FIG. 8 illustrates an integrated circuit device 200 in accordance with some embodiments. The integrated circuit device 200 further includes a capping layer 250 disposed between the high-k dielectric layer 224 and the multi-function blocking/wetting layer 242. The capping layer 250 further protects the high-k dielectric layer and/or reinforces the functions of the multi-function blocking/wetting layer 242. The capping layer 250 includes titanium nitride (TiN), tantalum nitride (TaN), or a combination thereof. The capping layer may be formed by a suitable technique, such as PVD. The capping layer may be formed at the operation 110 or alternatively at the operation 130 of the method 100. In some embodiments when the high-k dielectric layer 224 is formed at the operation 110, the capping layer 250 may be formed at the operation 110 as well, therefore protecting the high-k dielectric layer through the fabrication. In this case, both the high-k dielectric layer 224 and the capping layer 250 are only formed in the bottom of the opening 240 while the multi-function blocking/wetting layer 242 and the work function layer 244 are disposed on bottom and sidewalls of the opening 240, or are U-shaped in other words, as illustrated in FIG. 8. When the method 100 uses a high-k last process, the high-k dielectric layer is also formed at operation 130. In this case, the capping layer 250 is formed at the operation 130 as well. Therefore, both the high-k dielectric layer 224 and the capping layer 250 are formed on the sidewalls and are U-shaped.

Figure 9:
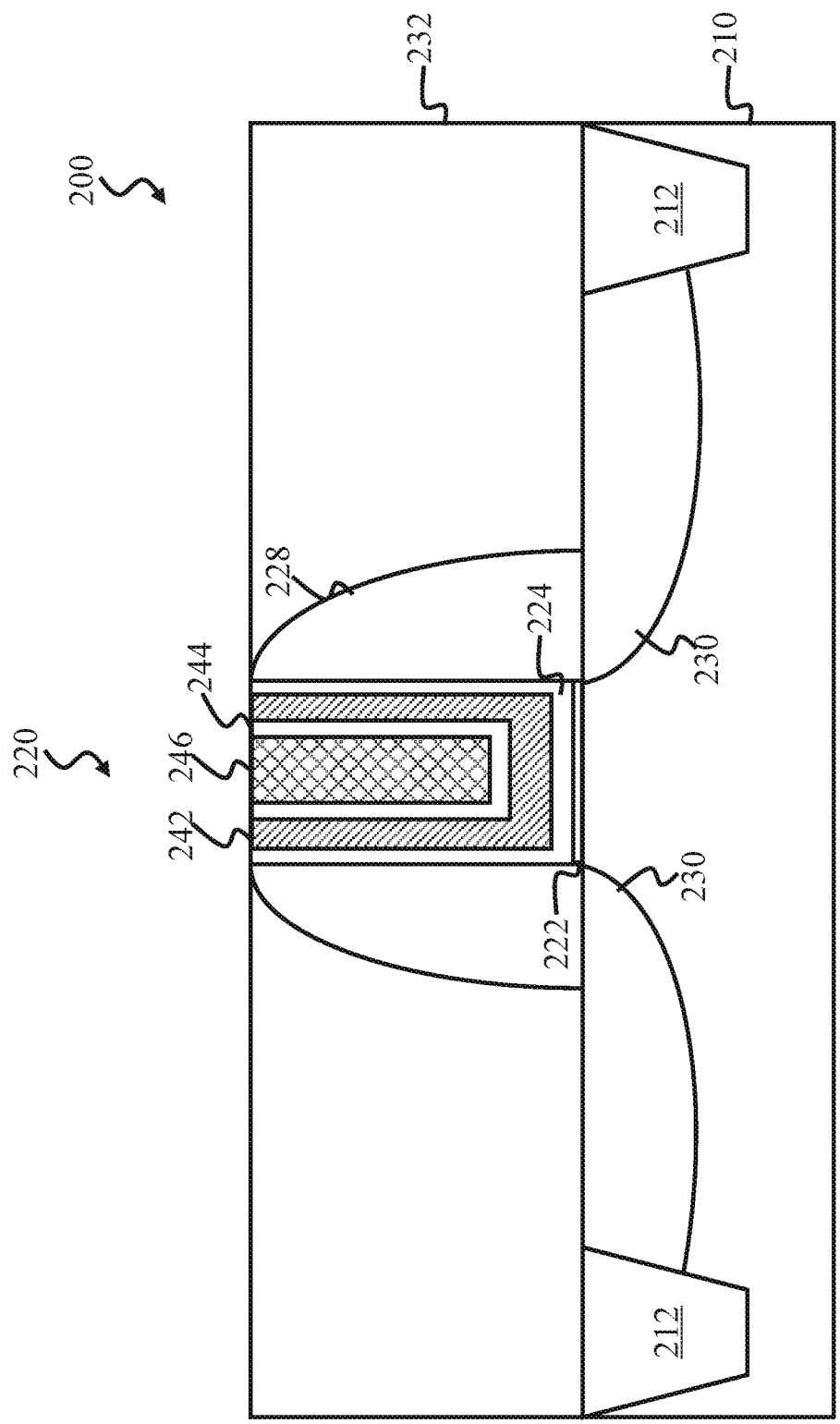

FIG. 9 illustrates an integrated circuit device 200 in accordance with some embodiments. The method 100 uses a high-k last process, the high-k dielectric layer is formed at operation 130 after the removal dummy gate stack by the operation 120. In this case, the dummy gate formed by the operation 110 may include a silicon oxide layer and a polysilicon layer over the silicon oxide layer. At the operation 120, the gate stack is removed by etching. Then the gate dielectric layer is formed in the opening 240 at the operation 130. Other gate material layers (such as 242, 246 and 248) are formed in the opening 240 in a similar way, such as those steps to form the material layer 242, 244 and 248 described above. Accordingly, the high-k dielectric layer is U-shaped as well. Again, of the capping layer 250 is present between the high-k dielectric layer 224 and the multi-function blocking/wetting layer 242, both the high-k dielectric layer 224 and the capping layer 250 are formed on the sidewalls and are U-shaped. The interfacial layer 222 may be removed at operation 120 and re-deposited at operation 130, such as by thermal oxidation (not U-shaped) or ALD (U-shaped).

Figure 10:
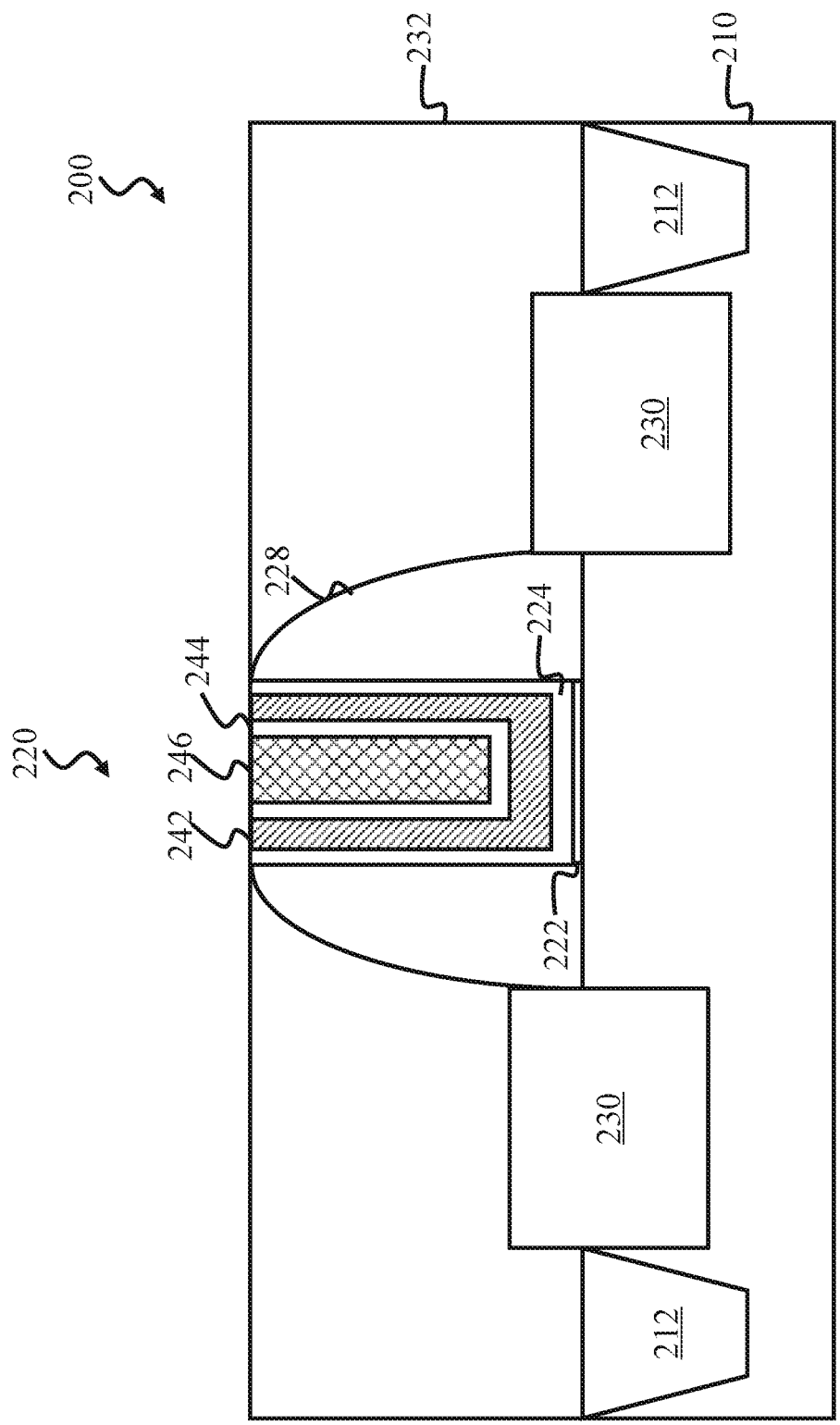

FIG. 10 illustrates an integrated circuit device 200 in accordance with some embodiments. The source and drain (S/D) features 230 are formed with different semiconductor material for strain effect, enhancing the channel mobility and device performance. At the operation 120, the source and drain features 230 are formed by a proper procedure. For example, the procedure may include: the substrate in the source and drain regions is etched to be recessed; and a semiconductor material different from that of the substrate is epitaxially grown in the recesses by selective epitaxy growth with in-situ doping. The semiconductor material is chosen to provide proper strain to the channel to enhance mobility, such as tensile strain to n-channel field effect transistor by using silicon carbide and compressive strain to p-channel field effect transistor by using silicon germanium. In one example, the device 200 is an nFET, the semiconductor material is silicon carbide doped with phosphorous for S/D features 230 while the substrate 210 is a silicon substrate. In one example, the device 200 is a pFET, the semiconductor material is silicon germanium doped with boron for S/D features 230 while the substrate 210 is a silicon substrate. In another example, the integrated circuit device 200 includes an nFET and a pFET, silicon carbide with phosphorous dopant is epitaxially grown to form S/D features 230 for the nFET, silicon germanium with boron dopant is epitaxially grown to form S/D features 230 for the pFET while the substrate 210 is a silicon substrate. The S/D features 230 may be epitaxially grown such that the top surface of the S/D features 230 is substantially coplanar with the top surface of the semiconductor substrate 210. Alternatively, the S/D features 230 may be epitaxially grown beyond the top surface of the semiconductor substrate 210, as illustrated in FIG. 10.

Figure 11:
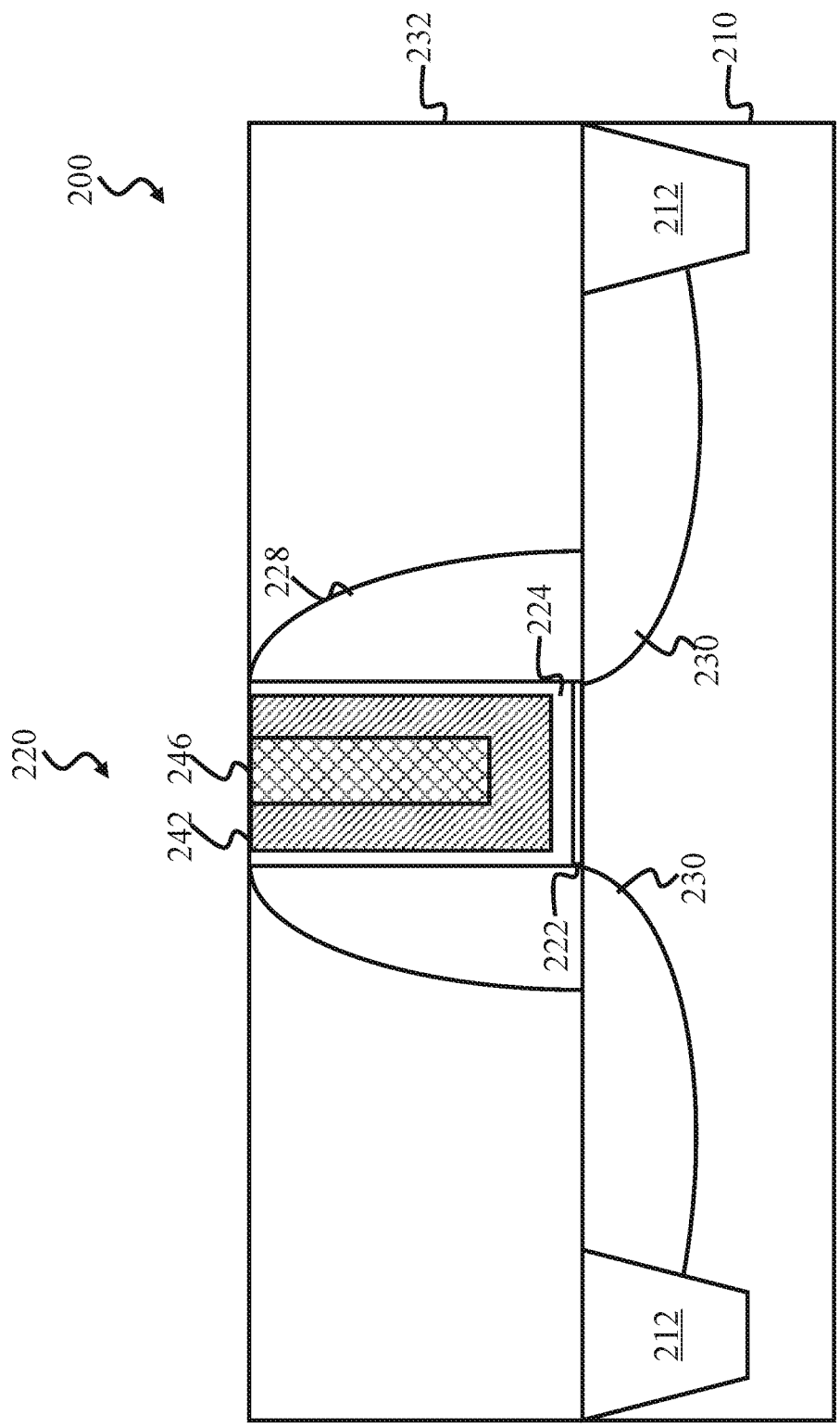

FIG. 11 illustrates an integrated circuit device 200 in accordance with some embodiments. In FIG. 11, the gate stack 220 includes the multi-function blocking/wetting layer 242 on the high-k dielectric layer 224 and a conductive layer 246 directly on the multi-function blocking/wetting layer 242. The conductive layer 246 may be aluminum for examples. The multi-function blocking/wetting layer 242 includes TaAlCN and is tuned to function as n work function metal layer as well. An atomic concentration of nitrogen and carbon of the TaAlCN layer is optimized, such that the multi-function blocking/wetting layer 242 adequately prevents or reduces metal impurities from penetrating underlying dielectric layers (for example, high-k dielectric layer 224 and interfacial layer 222) while having a proper work function, such as a work function ranging from about 4.1 eV to about 4.5 eV. In the depicted embodiment, the TaAlCN layer includes a nitrogen atomic concentration of about 3% to about 10%. The TaAlCN layer may include a carbon atomic concentration of about 5% to about 20%. The TaAlCN ratio may include a Ta:Al ratio that enhances interface quality (which can be referred to as wettability) between the multi-function blocking/wetting layer 242 and an overlying layer that includes aluminum. For example, the TaAlCN layer 242 includes a Ta:Al ratio of about 1:1 to about 1:3.

Figure 12:
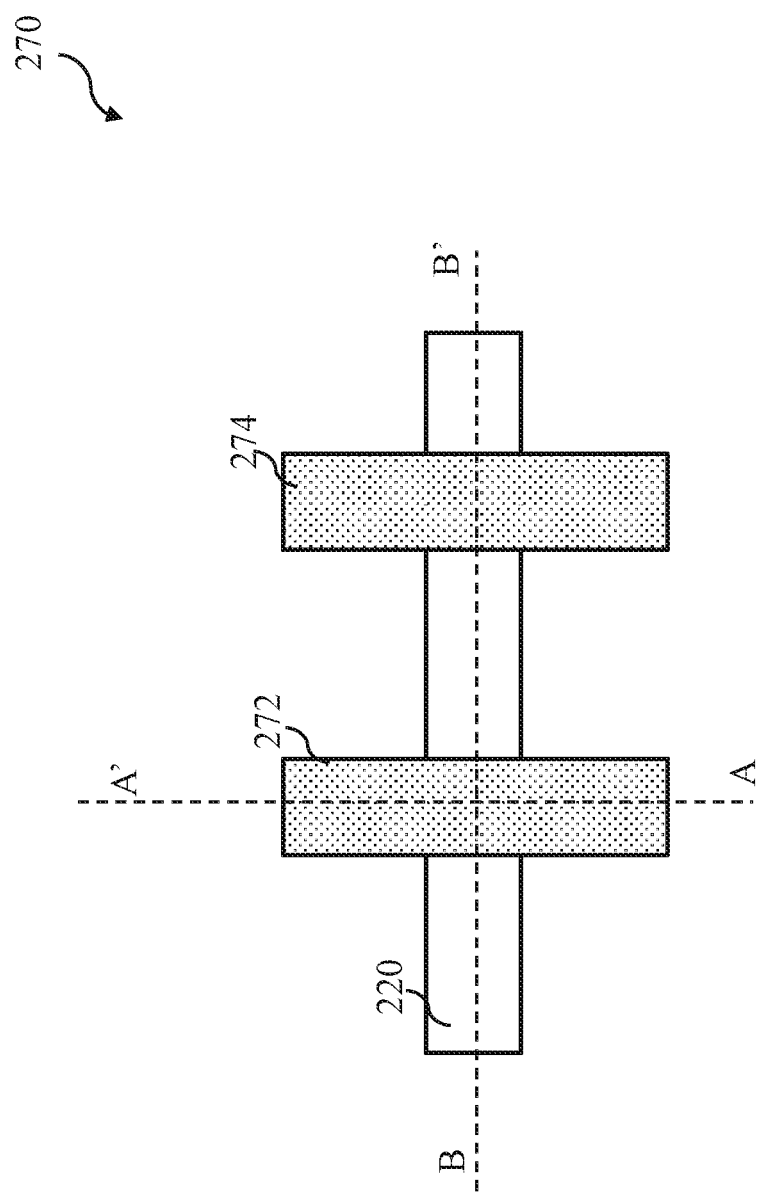
FIG. 12 is diagrammatic top view of an integrated circuit device in accordance with some embodiments.
Figure 13:
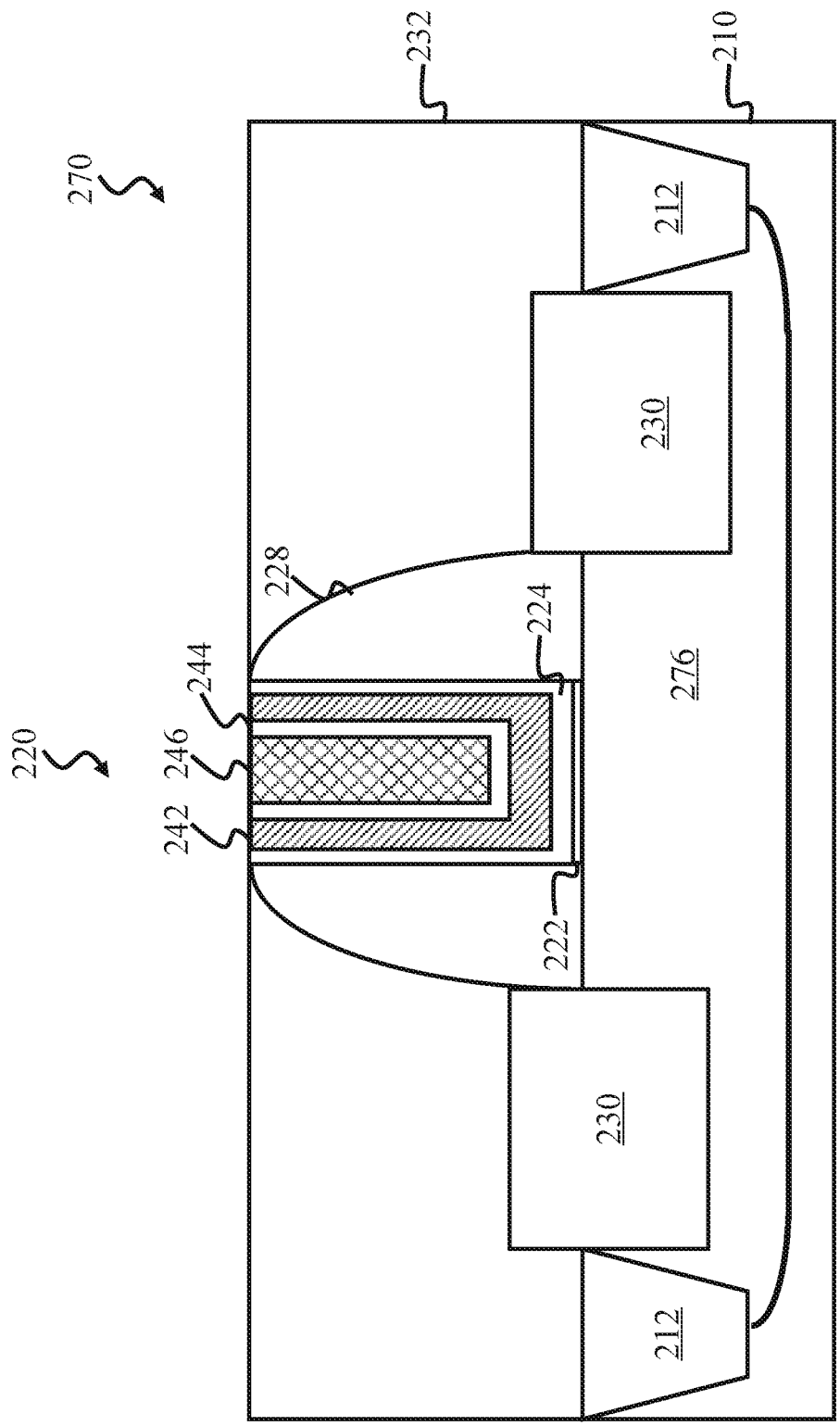
FIGS. 13 and 14 are diagrammatic cross-sectional views of the integrated circuit device of FIG. 12 in accordance with some embodiments.
Figure 14:
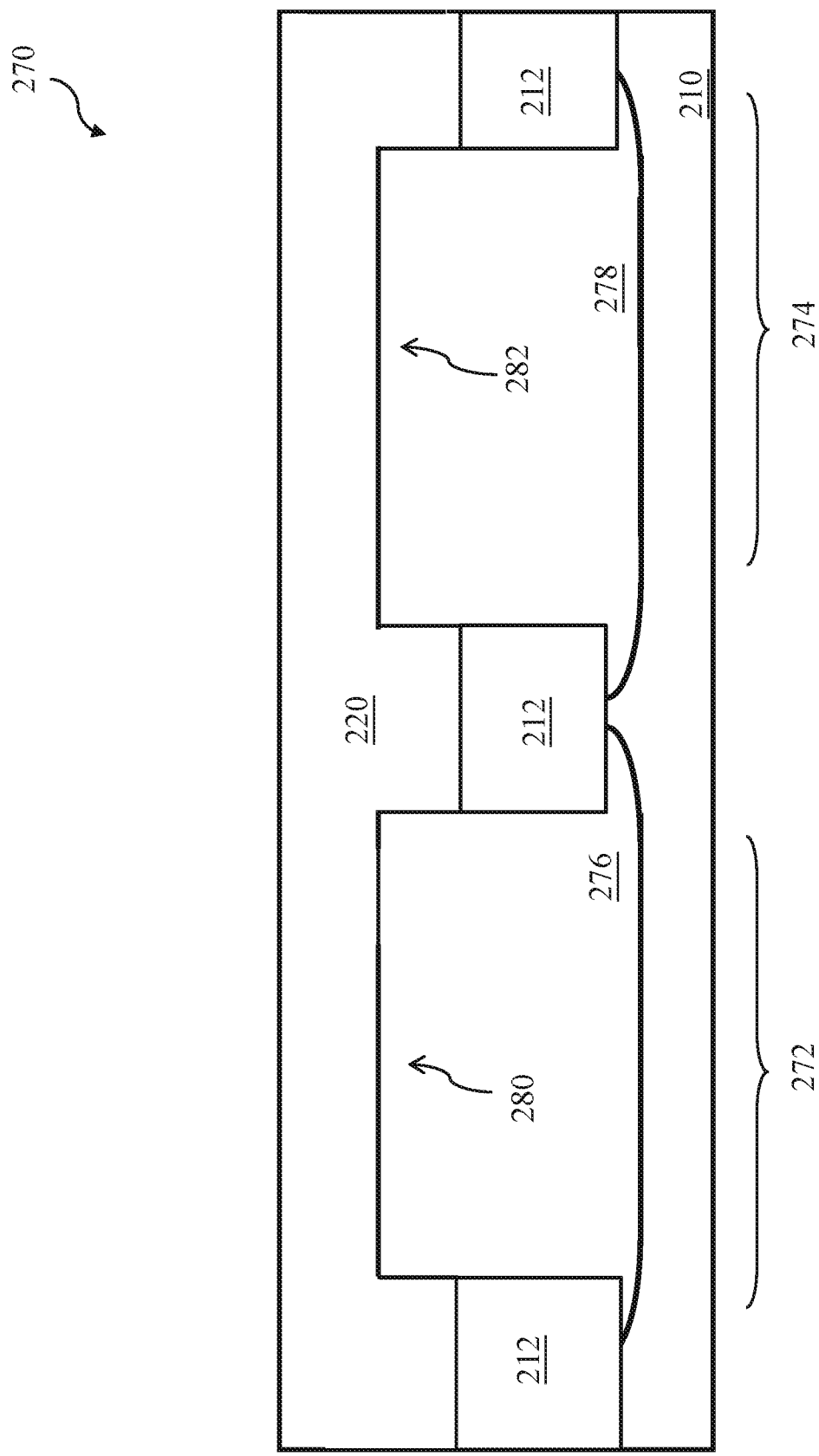

FIGS. 12-14 illustrate an integrated circuit (IC) structure 270 having a fin structure in accordance with some embodiments. FIG. 12 is a top view of the IC structure 270 in accordance with some embodiments. FIG. 13 is a sectional view of the IC structure 270 along the dashed line AA' in accordance with some embodiments. FIG. 14 is a sectional view of the IC structure 270 along the dashed line BB' in accordance with some embodiments. The IC structure 270 includes a first fin active region 272 and a second fin active region 274 formed on the semiconductor substrate 210. The fin active regions 272 and 274 are extended vertically above the top surface of the STI features 212. The semiconductor material of the fin active regions may be same or alternatively different from the semiconductor substrate 210. The fin active regions may be formed by etching to recess the STI features or by selective epitaxy growth. In one embodiment, the first fin active region 272 is for a nFET and the second fin active region 274 is for a pFET. In furtherance of the embodiment, a p-type doped well 276 is formed in the first fin active region 272, and a n-type doped well 278 is formed in the second fin active region 274, such as by ion implantations. Accordingly, a first channel region 280 and a second channel region 282 are defined in the first and second fin active regions, respectively.

In some embodiments, the S/D features 230 are formed by epitaxy growth for strain effect, such as those illustrated in FIG. 10. The gate stack 220 is formed over the fin active regions. The gate stack 220 is similar to the gate stack 220 of FIG. 7, or one of FIGS. 8-11 in various embodiments. In one embodiment when the active regions 272 and 274 are different conductive types, the gate stack 220 includes two portions of different material stacks, such as a first portion over the first fin active region 272 and a second portion over the second fin active region 274. Two portions are similar in composition except for the work function metal layer 244. In the first portion of the gate stack, the work function metal layer includes a nWF metal layer. In the second portion of the gate stack, the work function metal layer includes a pWF metal layer.

Although different embodiments are described. There are still other embodiments of the integrated circuit device that combines two or more above embodiments. For example, one integrated circuit device includes both epitaxy grown S/D features and a U-shaped high-k dielectric layer. In another example, one integrated circuit device includes both fin active region and with an additional capping layer 250.

A conventional gate stack includes a gate dielectric layer, a work function layer disposed over the gate dielectric layer; a blocking layer, such as a tantalum nitride (TaN) blocking layer, disposed over the work function layer; a wetting layer, such as a titanium (Ti) wetting layer, disposed over the blocking layer; and a conductive layer, such as an aluminum (Al) conductive layer, disposed over the wetting layer. The TaN blocking layer provides less than desirable blocking capability, and it has been observed that aluminum impurities from the aluminum conductive layer can penetrate the gate dielectric layer during processing. Further, though the Ti wetting layer provides sufficient wettability to the Al conductive layer, it has been observed that phase transformations occur between the Ti wetting layer and the Al conductive layer during processing, leading to portions of the TaN blocking layer interacting with Ti during processing, and eventually leading to missing portions of the TaN blocking layer (in other words, portions of the TaN blocking layer are consumed during processing). The missing portions of the TaN blocking layer further minimizes the TaN blocking layer's ability to prevent the aluminum impurities from penetrating the gate dielectric layer. Such phase transformations and missing portions of TaN blocking layer have also been observed when the gate stack includes a tantalum aluminum (TaAl) wetting layer.

To address such issues, the present disclosure replaces the separate TaN blocking layer and Ti wetting layer of conventional gate stacks with the TaAlCN multi-function blocking/wetting layer 242. The blocking ability of TaAlCN exceeds the blocking ability of TiN and TaN (specifically, blocking ability of TaAlCN>TaAlC>>TaN). Further, TaAlCN provides sufficient wettability to an Al conductive layer. Accordingly, the TaAlCN multi-function blocking/wetting layer provide improved blocking ability and wettability, leading to reduced leakage current and improved device performance, as compared to gate stacks including conventional TaN blocking layer/Ti wetting layer. Particularly, TaAlCN is more challenge than other materials, such as includes titanium aluminum carbon nitride (TiAlCN), in terms of formation, particle/residual issues, which as addressed in the integrated circuit device 200 and the method 100 making the same in accordance with various embodiments. Different embodiments may have different advantages, and that no particular advantage is necessarily required of any embodiment.

The present disclosure provides for many different embodiments. In some embodiments, an integrated circuit device includes a semiconductor substrate; and a gate stack disposed over the semiconductor substrate. The gate stack further includes a gate dielectric layer disposed over the semiconductor substrate; a multi-function blocking/wetting layer disposed over the gate dielectric layer, wherein the multi-function blocking/wetting layer comprises tantalum aluminum carbon nitride (TaAlCN); a work function layer disposed over the multi-function blocking/wetting layer; and a conductive layer disposed over the work function layer.

In some other embodiments, an integrated circuit device includes a semiconductor substrate having a first region for a n-channel field effect transistor and a second region for a p-channel channel field effect transistor; a first gate stack disposed over the semiconductor substrate within the first region; and a second gate stack disposed over the semiconductor substrate within the second region. The first gate stack includes a high-k dielectric layer disposed over the semiconductor substrate, a first tantalum aluminum carbon nitride (TaAlCN) layer disposed over the high-k dielectric layer, and an n work function (nWF) metal layer with a first work function disposed directly on the first TaAlCN layer. The second gate stack includes the high-k dielectric layer disposed over the semiconductor substrate, the first TaAlCN layer disposed over the high-k dielectric layer, and a p work function (pWF) metal layer with a second work function disposed directly on the first TaAlCN layer, the second work function being greater than the first work function.

In yet some other embodiments, a method includes forming a gate stack over a semiconductor substrate; forming an interlayer dielectric (ILD) layer surrounding the gate stack; at least partially removing the gate stack, thereby forming an opening in the ILD layer; and forming a multi-function blocking/wetting layer, a work function layer over the multi-function blocking/wetting layer, and a conductive layer over the work function layer. The multi-function blocking/wetting layer, the work function layer, and the conductive layer fill the opening. The multi-function blocking/wetting layer includes first tantalum aluminum carbon nitride (TaAlCN) layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a gate stack disposed over a substrate, the gate stack having:
        a gate dielectric layer disposed over the substrate;
        a multi-function layer disposed over the gate dielectric layer, wherein the multi-function layer includes a first metal carbonitride sub-layer having a first nitrogen (N) concentration and a second metal carbonitride sub-layer having a second N concentration, wherein the second metal carbonitride sub-layer is disposed over the first metal carbonitride sub-layer and the first N concentration is greater than the second N concentration; and
        a work function layer disposed over the multi-function layer, wherein the multi-function layer and the work function layer are U-shaped.

2. The device of claim 1, wherein the first N concentration is from about 5% to about 15% and the second N concentration is from about 2% to about 5%.

3. The device of claim 1, wherein the first metal carbonitride sub-layer is disposed directly on the gate dielectric layer.

4. The device of claim 1, wherein the multi-function layer further includes tantalum, aluminum, carbon, and nitrogen.

5. The device of claim 1, wherein the multi-function layer further includes titanium, aluminum, carbon, and nitrogen.

6. The device of claim 1, wherein the gate dielectric layer includes a high-k dielectric layer.

7. The device of claim 1, wherein a thickness of the work function layer is less than a thickness of the multi-function layer.

8. The device of claim 1, the gate stack further having a conductive layer disposed over the work function layer, wherein the work function layer is disposed along a bottom, a first sidewall, and a second sidewall of the conductive layer.

9. A transistor comprising:
    a substrate;
    a first source/drain region and a second source/drain region disposed in the substrate;
    a gate stack disposed over the substrate, wherein the gate stack is disposed between the first source/drain region and the second source/drain region, and further wherein the gate stack includes:
        a high-k dielectric layer disposed over the substrate,
        a capping layer disposed over the high-k dielectric layer, wherein the capping layer includes nitrogen and one of titanium or tantalum,
        a multi-function layer disposed over the high-k dielectric layer, wherein the multi-function layer includes nitrogen and one of titanium or tantalum, and
        a work function layer disposed over the multi-function layer, wherein the work function layer includes nitrogen and one of titanium or tantalum, and further wherein a concentration of the nitrogen of the work function layer is less than a concentration of the nitrogen of the multi-function layer; and
    gate spacers disposed along sidewalls of the gate stack.

10. The transistor of claim 9, wherein the concentration of the nitrogen of the work function layer is from about 2% to about 5% and the concentration of the nitrogen of the multi-function layer is from about 5% to about 15%.

11. The transistor of claim 9, wherein the multi-function layer further includes carbon, wherein a concentration of the carbon is from about 5% to about 20%.

12. The transistor of claim 9, wherein the multi-function layer includes titanium and further includes aluminum, and further wherein a ratio of the titanium to the aluminum is from about 1:1 to about 1:3.

13. The transistor of claim 9, wherein the multi-function layer includes tantalum and further includes aluminum, and further wherein a ratio of the tantalum to the aluminum is from about 1:1 to about 1:3.

14. The transistor of claim 9, wherein the multi-function layer and the work function layer include tantalum, and the multifunction layer and the work function layer further include aluminum.

15. The transistor of claim 9, wherein a thickness of the work function layer is less than a thickness of the multi-function layer.

16. A transistor comprising:
    a metal gate stack having:
        a multi-function layer that includes nitrogen and one of titanium or tantalum,
        a work function layer disposed over the multi-function layer, wherein the work function layer includes nitrogen and one of titanium or tantalum, and further wherein a concentration of the nitrogen of the work function layer is less than a concentration of the nitrogen of the multi-function layer, wherein the concentration of the nitrogen of the work function layer is from about 2% to about 5% and the concentration of the nitrogen of the multi-function layer is from about 5% to about 15%, and
        a conductive layer disposed over the work function layer.

17. The transistor of claim 16, wherein the metal gate stack further includes a gate dielectric layer and a capping layer disposed over the gate dielectric layer, wherein the capping layer includes nitrogen and one of titanium or tantalum.

18. The transistor of claim 16, wherein the conductive layer includes aluminum.

19. The transistor of claim 16, wherein the multi-function layer and the work function layer further include aluminum.

20. The transistor of claim 16, wherein the multi-function layer further includes carbon.

* * * * *